United States Patent [19]

Fang

[11] Patent Number: 4,898,260

[45] Date of Patent: Feb. 6, 1990

[54] LOUDSPEAKER MOUNTING WITH INTEGRAL BACK WAVE FILTER AND WAVE MODULATING PLATE OF SAME DESIGN

[75] Inventor: Jimmy Fang, Monterey Park, Calif.

[73] Assignee: Peter Tsung Hoes Fei, Costa Mesa, Calif.

[21] Appl. No.: 154,202

[22] Filed: Feb. 11, 1988

[51] Int. Cl.⁴ ................................................ H05K 5/00

[52] U.S. Cl. .................................... 181/148; 181/151; 181/156; 381/153; 381/158

[58] Field of Search ............... 181/146, 148, 151, 156, 181/166, 171, 175, 189; 381/153, 158, 161, 162, 205

[56] References Cited

U.S. PATENT DOCUMENTS

| | | | |
|---|---|---|---|
| 2,069,242 | 2/1937 | Graham | 181/172 X |
| 3,684,051 | 8/1972 | Hopkins | 181/199 |
| 4,525,817 | 6/1985 | Takuya | 381/158 X |

*Primary Examiner*—B. R. Fuller
*Attorney, Agent, or Firm*—Cushman, Darby & Cushman

[57] ABSTRACT

An improved loud speaker mounting frame having a continuous conic shape in cross section, so that by means of the conic and apertures along the apex on one side of the conic cross section shape the interference of negative sound waves within the cabinet is reduced and resonance problems of the cabinet are eliminated. Efficiency of the loud speaker system is thereby improved. The concept of conic formation includes an improved V-shaped filtering wave modulation plate utilized in small speaker cabinets.

15 Claims, 3 Drawing Sheets

LOUDSPEAKER MOUNTING WITH INTEGRAL BACK WAVE FILTER AND WAVE MODULATING PLATE OF SAME DESIGN

BACKGROUND OF THE INVENTION

The present invention relates to a loud speaker frame. A typical loudspeaker is an electromagnet surrounded by and attached to a cone which upon electrical stimulation vibrates. The motions of the cone are perpendicular, producing sound waves opposed in phase. If these two contrary sound waves come into contact, mutual destruction occurs. Thus a main function of a speaker cabinet is to effectively prevent interference between the opposing sound waves. Conventional speaker cabinets are basically of two types, the infinite-baffle (sealed) variety, and the bass-reflex (ported) variety, each with their associated problems. In the former type, the cone receives the interference of negative sound waves generated within the cabinet, suppressing sound wave output; in the latter variety an exaggerated cabinet resonance character produces an inequity of sound waves.

The present invention includes means for effectively eliminating both of the aforementioned problems by use of a speaker having a unique frame possessing a uniquely corrugated shape and a plurality of apertures, and a new type wave modulation plate patterned after such a frame, both of which are especially suitable for use in smaller size speaker enclosures.

OBJECTS OF THE INVENTION

It is an object of the present invention to provide an improved loudspeaker having a uniquely designed frame which includes a continuous comic shape or V-shape in cross section and a plurality of apertures disposed along the apex on one side of the conic or V-shaped cross section.

It is an additional object to provide such a speaker frame which includes means for effectively reducing the interference of negative sound waves generated within the cabinet, eliminating cabinet resonance problems, and reducing distortion in middle and low frequencies such as most commonly occurs in small size cabinets.

It is also an object of the present invention to provide a newly designed wave modulation plate of continuous conic shape or V-shape in cross section and a plurality of apertures disposed along the apex on one side of the conic or V-shaped cross section.

It is an additional object to provide a wave modulation plate which includes means for effectively reducing the interference of negative sound waves generated within a loudspeaker cabinet, eliminating cabinet resonance problems, and reducing distortion in middle and low frequencies such as most commonly occurs in small size cabinets.

It is also an object of the present invention to use the above-mentioned uniquely designed loudspeaker frame in combination with the said wave modulation plate.

It is an additional object to provide such a wave modulation plate which can effectively restrict the flow of sound while concurrently allowing the free passage of air, and thus can be utilized in television enclosures, converter enclosures and the like.

DETAILED DESCRIPTION OF THE PREFERRED EMBODIMENT

Figure 2:
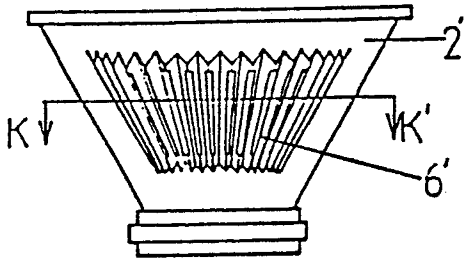
FIG. 2 shows an embodiment of a loudspeaker frame having a filtering aperture type frame according to the present invention, in which the apertures (6') of the frame (2') are an open-filter, continuous conic or V-shape in cross section.
Figure 3:
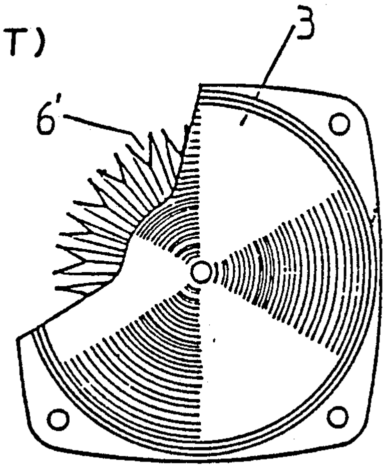
FIG. 3 is a front view of an embodiment of a loudspeaker having a partial section of the filtering aperture type frame according to the present invention, whereby the closed ends of the frame having the conic-shaped cross section face the cone (3).
Figure 4:
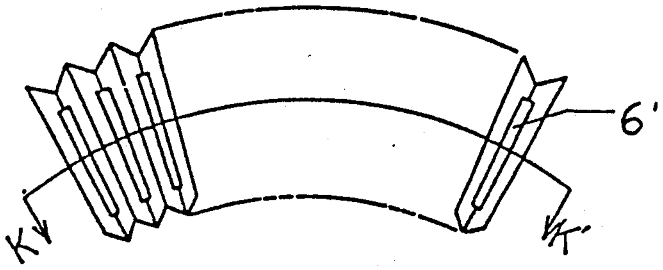
FIG. 4 is a detailed extended plane view of the frame of FIG. 2.
Figure 5:
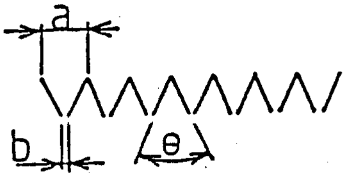
FIG. 5 is an extended cross sectional view long the line KK' of FIG. 4 in which a is greater than b and angle $\theta$ of each triangular shaped is less than 90°.

The characteristics of the present invention are shown in the unique design of the mounting frame as shown in FIG. 2.

Figure 1:
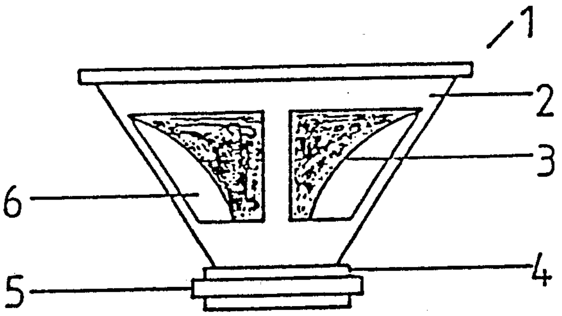
FIG. 1 (PRIOR ART)
FIG. 1 is a view showing the structure of a typical loudspeaker (1) comprised of a mounting frame (2), a sound producing cone (3), a yoke (4), a permanent magnet (5), and apertures (6) provided in the mounting frame for sound and air to pass therethrough.

To reduce the interference of reflected negative sound waves with the sound producing cone of a cabinet mounted speaker, according to the present invention, the apertures of a conventional speaker cone mounting frame (FIG. 1) are regulated by in an open type filter formed in a continuous conic or V-shape in cross section (FIGS. 2–5) of which the apex faces the cone 3 and the side having the apertures is facing away from cone 3. The triangular shape is characterized in that the distance a between the base points of any conic or V-shape is greater than the corresponding and opposite distance b, and the angle $\theta$ of each conic-shaped cross section is less than 90°. The principles on which the present invention functions are as follows:

When a typical loudspeaker is installed into a cabinet, negative sound waves tend to reflect back into contact with the moving cone, and the smaller the cabinet, the closer the phase difference between the opposing wave forms so created; the reflected sound waves thus not only tend to suppress the output, but tend to produce a resonant frequency corresponding to the space inside the cabinet. Thus, sounds of certain frequencies are emphasized and an inequity of frequency response results; this phenomenon is particularly perceptible in smaller enclosures at lower frequencies.

With the continuous conic or V-shape effect of the present invention however, the reflected sound waves within the cabinet are less likely to reflect through the apertures within the conic shapes and are more likely to be absorbed by the walls of the cabinet or the sound absorbing material usually fixed therein. The small fraction of negative waves that leak back to the cone area are reduced in number and delayed in time so that interference with the cone is minimized, producing an improved middle and lower frequency response, especially those sounds which are most difficult to reproduce accurately in small speaker cabinets.

In general, light thin cone material is used for the sound producing cone of a loudspeaker. Typically, deformation of the cone occurs upon vibration, to a lesser degree when moving forward (away from the magnet) and to a greater degree when moving backward (toward the magnet). According to the present invention, air flow caused by the vibration of the cone is actually adjusted by means of the filtering frame; deformation differences are reduced, and waveform distortion is alleviated.

Figure 6:
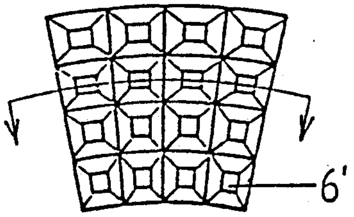
FIG. 6 shows another embodiment of the filtering aperture type frame according to the present invention in which the apertures are located within rectangular conical shapes.
Figure 7:
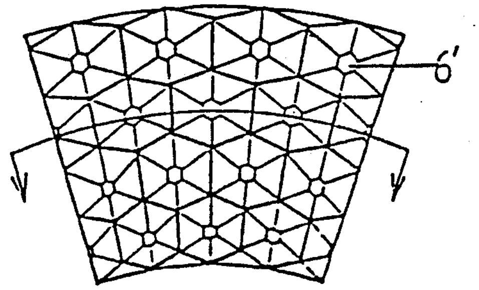
FIG. 7 shows another embodiment of the filtering aperture type frame according to the present invention wherein the apertures are located within conical shapes formed in the shape of beehives.
Figure 8:
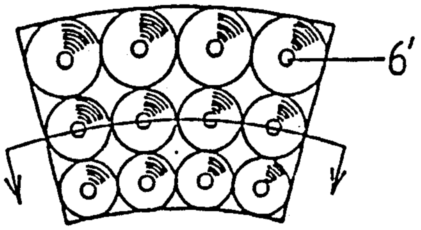
FIG. 8 shows another embodiment of the filtering aperture type frame according to the present invention wherein the apertures are located within conic shapes formed in substantially circular shapes.

The filtering frame of the loudspeaker of the present invention can be formed of any rigid material and the wave modulating plate thereof is formed into random continuous geometric shapes such as elongated stripes, cups, beehive shapes and the like (FIGS. 6–8).

Figure 9:
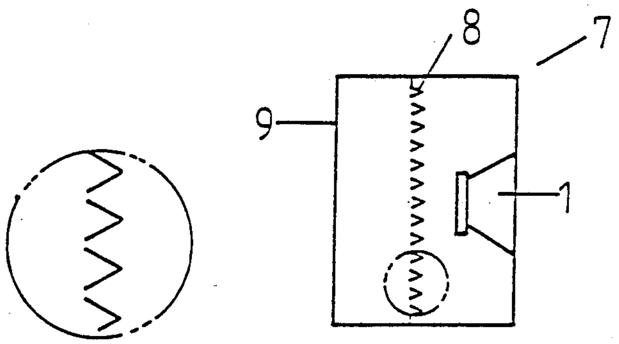
FIG. 9 is a view showing a possible arrangement of a loudspeaker system according to the present invention wherein the wave modulation plate (8) is mounted in a cabinet, whereby the closed ends of the corrugated plate face the loudspeaker (1).
Figure 11:
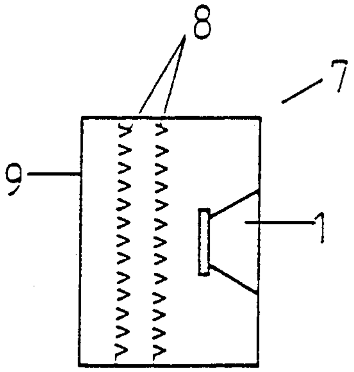
FIG. 11 is a view showing a possible arrangement in the loudspeaker cabinet of FIG. 9 wherein multi-layers of said wave modulating plate are used.
Figure 10:
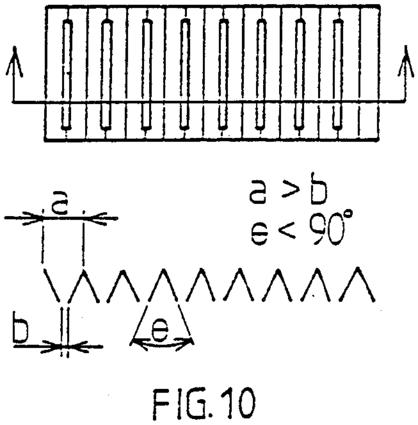
FIG. 10 is a cross sectional view of the wave modulating plate according to the present invention.
Figure 12:
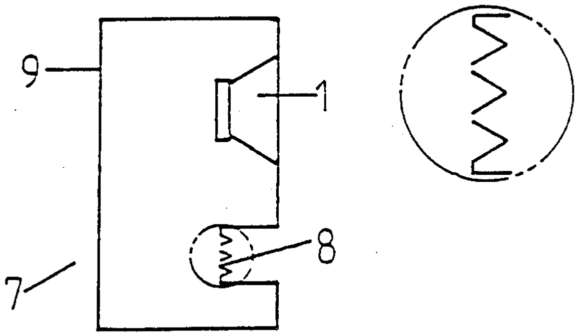
FIG. 12 is a view showing an arrangement using an inverted filtering aperture type wave modulating plate mounted in a port of a loudspeaker cabinet.

The structure of a loudspeaker cabinet (7) according to another embodiment of the present invention is shown in FIG. 9 and comprises a loudspeaker (1), a wave modulating plate (8), an enclosing cabinet (9), and is characterized in that the wave modulating plate is constructed according to the characteristics of the above mentioned conic configuration the plate comprises a corrugated structure having a conic or V-shaped cross section with a plurality of apertures at the apex on one side of the corrugated structure. Additionally, such a conic shaped wave modulating plate can be multi-layered to further enhance the above mentioned improvements. In this particular embodiment, the wave modulating plate is mounted between the loudspeaker (1) and a back wall of the enclosing cabinet (9).

In the alternative, the wave modulating plate may be positioned in reverse so that the side having the apertures face away from speaker 1: this may be desirable in equipment where air must be able to flow through in order to reduce leakage of sound. Also, the plate can be formed having its conic cross section without the constraint of FIG. 5 that a is greater than b and $\theta$ is less than 90°.

Although the present invention has been described in connection with various preferred embodiments, it is to be understood that numerous modifications, changes, and equivalents can be made by those skilled in the art, all of which fall within the true scope contemplated by the invention, as set forth in the appended claims.

I claim:

1. An improved loudspeaker located within a speaker cabinet, the loudspeaker comprising:
   - a speaker cone for generating sound waves; and
   - a filtering frame for reducing interference of said speaker cone from negative sound waves generated within said cabinet, said speaker cone being mounted on said filtering frame,
   - said filtering frame comprising:
     - a corrugated filter having a conically-shaped cross section with a plurality of apexes, said corrugated filter being substantially rigid and having a first and second side, and
     - a plurality of apertures located on said first side at corresponding apexes of said corrugated filter.

2. An improved loudspeaker as recited in claim 1, wherein said first side of said corrugated filter is facing away from said speaker cone.

3. An improved loudspeaker as recited in claim 2, wherein said corrugated filter circumscribes a circumference of said speaker cone.

4. An improved loudspeaker as recited in claim 3, wherein said corrugated filter comprises a plurality of adjacent rectangular shapes.

5. An improved loudspeaker as recited in claim 3, wherein said corrugated filter comprises a plurality of adjacent circular shapes.

6. An improved loudspeaker as recited in claim 3, wherein said corrugated filter comprises a plurality of adjacent hexagonal shapes.

7. A wave modulation plate for reducing interference between a loudspeaker mounted in a loudspeaker cabinet and negative sound waves generated therein, the wave modulation plate comprising:
   - a corrugated filter having a conically-shaped cross section with a plurality of apexes, said corrugated filter being substantially rigid and having a first and second side; and
   - a plurality of apertures located on said first side at corresponding apexes of said corrugated filter;
   - wherein said wave modulation plate is mounted between said loudspeaker and a back wall of said loudspeaker cabinet, said wave modulation plate allowing sound waves generated by said loudspeaker to pass through said wave modulation plate.

8. A wave modulation plate as recited in claim 7, wherein said first side of said corrugated filter is facing said back wall.

9. A wave modulation plate as recited in claim 8, wherein said corrugated filter comprises a plurality of adjacent rectangular shapes.

10. A wave modulation plate as recited in claim 8, wherein said corrugated filter comprises a plurality of adjacent circular shapes.

11. A wave modulation plate as recited in claim 8, wherein said corrugated filter comprises a plurality of adjacent hexagonal shapes.

12. An improved loudspeaker system having a speaker cabinet with a loudspeaker mounted therein, comprising:
    - a port hole located in a wall of said speaker cabinet; and
    - a wave modulating plate located within said port hole, said wave modulating plate comprising:
    - a corrugated filter having a conically-shaped cross section with a plurality of apexes, said corrugated filter being substantially rigid and having a first and second side, and a plurality of apertures located on said first side at corresponding apexes of said corrugated filter, said first side facing a wall of said speaker cabinet opposite said port hole.

13. An improved loudspeaker system as recited in claim 12, wherein said corrugated filter comprises a plurality of adjacent rectangular shapes.

14. An improved loudspeaker system as recited in claim 12, wherein said corrugated filter comprises a plurality of adjacent circular shapes.

15. An improved loudspeaker system as recited in claim 12, wherein said corrugated filter comprises a plurality of adjacent hexagonal shapes.

* * * * *